United States Patent
Wu

(10) Patent No.: US 8,783,911 B2
(45) Date of Patent: Jul. 22, 2014

(54) LED PACKAGING STRUCTURE HAVING IMPROVED THERMAL DISSIPATION AND MECHANICAL STRENGTH

(75) Inventor: Yi-Tsuo Wu, Yonghe (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 24 days.

(21) Appl. No.: 13/399,027

(22) Filed: Feb. 17, 2012

(65) Prior Publication Data

US 2013/0215613 A1 Aug. 22, 2013

(51) Int. Cl.
*F21V 29/00* (2006.01)

(52) U.S. Cl.
USPC ............ 362/294; 362/373; 362/249.02

(58) Field of Classification Search
USPC ................... 362/294, 373, 249.02
See application file for complete search history.

(56) References Cited

U.S. PATENT DOCUMENTS

| 7,659,551 | B2 * | 2/2010 | Loh ................................. 257/98 |
| 8,342,711 | B2 * | 1/2013 | Lin et al. ................... 362/249.02 |
| 8,354,684 | B2 * | 1/2013 | West ................................. 257/98 |
| 2010/0302777 | A1 * | 12/2010 | Knoll et al. ..................... 362/235 |
| 2011/0090691 | A1 * | 4/2011 | Markle et al. ............ 362/249.02 |
| 2012/0020086 | A1 * | 1/2012 | Kataoka ................... 362/249.02 |

* cited by examiner

*Primary Examiner* — Peggy Neils
(74) *Attorney, Agent, or Firm* — Haynes and Boone, LLP

(57) ABSTRACT

The present disclosure involves a lighting apparatus. The lighting apparatus includes a thermally-conductive substrate. The thermally-conductive substrate may include a substrate. The lighting apparatus also includes a printed circuit board (PCB). The PCB is located besides the thermally-conductive substrate. The PCB and the thermally-conductive substrate have different material compositions. The lighting apparatus also includes a photonic device located over the thermally-conductive substrate. The photonic device may include a light-emitting diode (LED) die. The photonic device is thermally coupled to the thermally-conductive substrate. The photonic device is electrically coupled to the printed circuit board. The lighting apparatus also includes a thermal dissipation structure. The thermal dissipation structure is thermally coupled to the thermally-conductive substrate.

18 Claims, 5 Drawing Sheets

US 8,783,911 B2

LED PACKAGING STRUCTURE HAVING IMPROVED THERMAL DISSIPATION AND MECHANICAL STRENGTH

TECHNICAL FIELD

The present disclosure relates generally to light-emitting devices, and more particularly, to an improved packaging structure for light-emitting diode (LED) devices.

BACKGROUND

LED devices are semiconductor photonic devices that emit light when a voltage is applied. LED devices have increasingly gained popularity due to favorable characteristics such as small device size, long lifetime, efficient energy consumption, and good durability and reliability. In recent years, LED devices have been deployed in various applications, including indicators, light sensors, traffic lights, broadband data transmission, and illumination devices. For example, LED devices are often used in illumination devices provided to replace conventional incandescent light bulbs, such as those used in a typical lamp.

LED devices rely on a packaging structure for mechanical support and for heat dissipation. However, traditional LED packaging structures may suffer from inefficient heat dissipation and weak mechanical strength problems. Therefore, while existing packaging structures for LED devices have been generally adequate for their intended purposes, they have not been entirely satisfactory in every aspect. LED packaging structures having stronger mechanical strength and more efficient heat dissipation characteristics continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

SUMMARY

Figure 1:
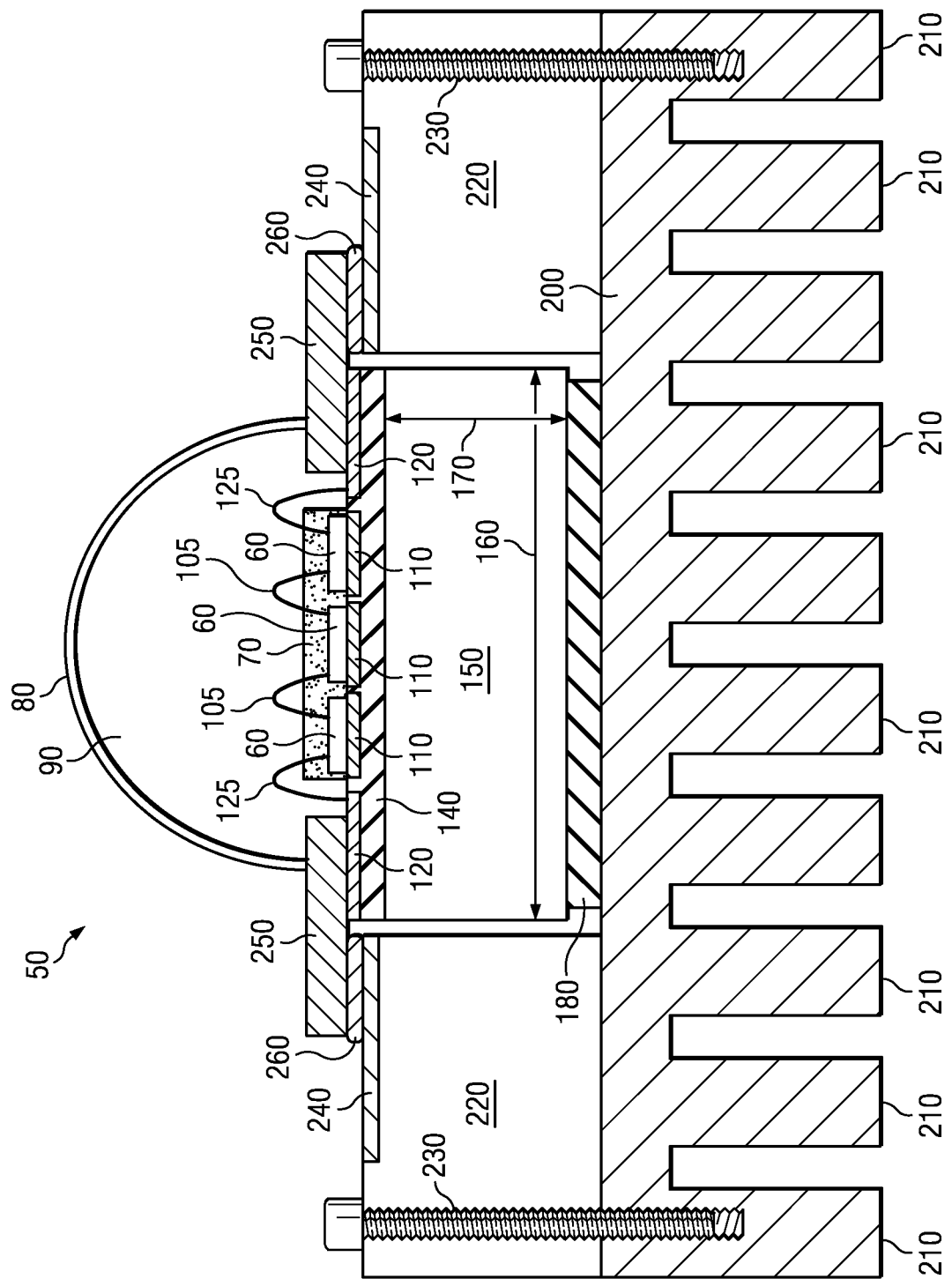
FIG. 1 is a diagrammatic fragmentary cross-sectional side view of an example lighting apparatus using a semiconductor photonic device as a light source according to various aspects of the present disclosure.

One of the broader forms of the present disclosure involves a lighting apparatus. The lighting apparatus includes: a thermally-conductive substrate; a printed circuit board located besides the thermally-conductive substrate, the printed circuit board and the thermally-conductive substrate having different material compositions; a photonic device located over the thermally-conductive substrate, the photonic device being thermally coupled to the thermally-conductive substrate and electrically coupled to the printed circuit board; and a thermal dissipation structure thermally coupled to the thermally-conductive substrate.

In some embodiments, the thermally-conductive substrate includes a substrate free of electrical routing therein.

In some embodiments, the photonic device is thermally coupled to the thermally-conductive substrate through a thermally conductive but electrically insulating layer.

In some embodiments, the photonic device is electrically coupled to the printed circuited board through one or more metal pads.

In some embodiments, the photonic device includes one or more light-emitting diode (LED) dies.

In some embodiments, the thermally-conductive substrate is surrounded by the printed circuit board in a top view.

In some embodiments, a sidewall of the thermally-conductive substrate is spaced apart from a sidewall of the printed circuit board.

In some embodiments, the printed circuit board is attached to the thermal dissipation structure by one or more screws.

In some embodiments, the photonic device and the thermal dissipation structure are located on opposite sides of the thermally-conductive substrate.

Another one of the broader forms of the present disclosure involves a photonic lighting module. The photonic module includes: a heat sink; a substrate disposed over the heat sink and thermally coupled to the heat sink; a printed circuit board substrate disposed over the heat sink, the printed circuit board substrate surrounding the substrate; a plurality of metal pads disposed at least partially over the substrate and over the printed circuit board substrate; and one or more light-emitting devices disposed on a subset of the metal pads; wherein: the one or more light-emitting devices are thermally coupled to the heat sink through the substrate; and the one or more light-emitting devices are electrically coupled to the printed circuit board substrate through the metal pads.

In some embodiments, the light-emitting devices include light-emitting diodes.

In some embodiments, the photonic lighting module further includes: an electrically-insulating layer disposed between the substrate and the one or more light-emitting devices; and a thermally-conductive layer disposed between the substrate and the heat sink, the electrically-insulating layer and the thermally-conductive layer being disposed on opposite sides of the substrate.

In some embodiments, the substrate is free of being in physical contact with the printed circuit board substrate.

In some embodiments, the photonic lighting module further includes a cap disposed over the substrate, wherein the cap houses the one or more light-emitting devices therein.

In some embodiments, the printed circuit board substrate contains electrical routing circuitry; and the substrate contains no electrical routing circuitry.

Still another one of the broader forms of the present disclosure involves a packaging structure for a light-emitting device. The packaging structure includes: a printed circuit board structure having an opening that extends therethrough; a substrate positioned within the opening of the printed circuit board structure; a heat sink on which the printed circuit board structure and the substrate are located; a first metal pad located over the substrate, wherein the light-emitting device is thermally coupled to the first metal pad; and a second metal pad located over the printed circuit board substrate, wherein the second metal pad is electrically coupled to the light-emitting device.

In some embodiments, the light-emitting device includes a light-emitting diode die.

In some embodiments, a sidewall of the substrate is free of being in physical contact with a sidewall of the printed circuit board structure.

In some embodiments, the packaging structure further includes a cap disposed over the substrate and housing the light-emitting device therein.

In some embodiments, the packaging structure further includes a third metal pad disposed partially over both the substrate and the printed circuit board structure, wherein the third metal pad is electrically coupled to the second metal pad through a solder material and to the light-emitting device through a bonding wire.

Yet another one of the broader forms of the present disclosure involves a method of fabricating a photonic lighting apparatus. The method includes: obtaining a first substrate having a plurality of light-emitting diode (LED) dies disposed thereon, the LED dies being thermally coupled to the substrate; obtaining a second substrate, the second substrate including a printed circuit board (PCB) and an opening that extends therethrough the PCB; and placing the first substrate within the opening of the second substrate such that the LED dies are located above, and electrically coupled to, the second substrate.

In some embodiments, the first substrate has a first metal pad located on, and extends beyond, the first substrate; the second substrate has a second metal pad located thereon; and the placing is performed such that the first metal pad is placed on the second metal pad.

In some embodiments, the first metal pad is electrically coupled to at least one of the LED dies.

In some embodiments, the placing is performed such that a sidewall of the first substrate is free of being in physical contact with a sidewall of the second substrate defining the opening.

In some embodiments, the substrate is one of: a silicon substrate and a ceramic substrate.

In some embodiments, the PCB substrate includes one or more electrical routing layers electrically coupled to the second metal pad.

In some embodiments, the method further includes: attaching the first substrate and the second substrate to a heat sink.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diode (LED) devices. When turned on, LED devices may emit radiation such as different colors of light in a visible spectrum, as well as radiation with ultraviolet or infrared wavelengths. Compared to traditional light sources (e.g., incandescent light bulbs), lighting instruments using LED devices as light sources offer advantages such as smaller size, lower energy consumption, longer lifetime, variety of available colors, and greater durability and reliability. These advantages, as well as advancements in LED fabrication technologies that have made LED devices cheaper and more robust, have added to the growing popularity of LED-based lighting instruments in recent years.

Nevertheless, existing LED devices may face certain shortcomings. One such shortcoming is that the packaging structure for conventional LED devices may have weak mechanical strength and/or poor heat dissipation characteristics. Mechanically-weak LED packaging structures may result in physical failures such as breaking of the packaging structure, and inefficient heat dissipation may degrade the light output uniformity of the LED device and shorten the lifetime of the LED device. Therefore, it is desirable to improve the mechanical strength and heat dissipation capabilities of conventional LED packaging structures.

According to various aspects of the present disclosure, described below is a lighting apparatus that substantially improves light output uniformity and heat dissipation compared to traditional LED-based lighting instruments. Referring to FIG. 1, a diagrammatic fragmentary cross-sectional side view of a portion of a lighting instrument 50 is illustrated according to some embodiments of the present disclosure. The lighting instrument 50 includes a plurality of semiconductor photonic dies 60 as light sources. The semiconductor photonic dies 60 are LED dies in the present embodiment, and as such may be referred to as LED dies 60 in the following paragraphs.

The LED dies 60 each include two oppositely doped semiconductor layers. In one embodiment, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In the present embodiment, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

The LED dies 60 also each include a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses.

It is understood that each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped semiconductor layers and the MQW layer may all be formed by an epitaxial growth process known in the art. After the completion of the epitaxial growth process, an LED is created by the disposition of the MQW layer between the doped layers. When an electrical voltage (or electrical charge) is applied to the doped layers of the LED, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. The LED dies 60 may also include electrodes or contacts that allow the LED dies 60 to be electrically coupled to external devices.

In the embodiments illustrated in FIG. 1, the LED dies 60 have a phosphor layer 70 coated thereon. The phosphor layer 70 may include either phosphorescent materials and/or fluorescent materials. The phosphor layer 70 may be coated on the surfaces of the LED dies 60 in a concentrated viscous fluid medium (e.g., liquid glue). As the viscous liquid sets or cures, the phosphor material becomes a part of the LED package. In practical LED applications, the phosphor layer 70 may be used to transform the color of the light emitted by an LED dies 60. For example, the phosphor layer 70 can transform a blue light emitted by an LED die 60 into a different wavelength light. By changing the material composition of the phosphor layer 70, the desired light color emitted by the lighting instrument 50 may be achieved.

The lighting instrument 50 includes a cap 80. The cap 80 provides a cover for the LED dies 60 therebelow. Stated differently, the LED dies 60 are encapsulated by the cap 80 and the substrate 120 collectively. In certain embodiments, the cap 80 may be transparent or translucent. In some embodiments, the cap 80 has a curved surface or profile. In some embodiments, the curved surface may substantially follow the contours of a semicircle, so that each beam of light emitted by the LED dies 60 may reach the surface of the cap 80 at a substantially right incident angle, for example, within a few degrees of 90 degrees. The curved shape of the cap 80 helps reduce Total Internal Reflection (TIR) of the light emitted by the LED dies 60.

In some embodiments, the cap 80 has a diffusive and textured surface. For example, the textured surface may be roughened to help scatter the light emitted by the LED dies 60, which makes the light output more uniform. In more detail, it would be undesirable to have a light output that is very intense (bright) in some directions or spots and weak (dim) in other directions or spots. The textured surface of the cap 80 allows incident light to be reflected in a plurality of different directions. Consequently, the result is that the light output is less likely to contain spots having varying degrees of brightness—thereby improving light output uniformity.

In some embodiments, a space 90 between the LED dies 60 and the cap 80 is filled by air. In another embodiment, the space 90 may be filled by an optical-grade silicone-based adhesive material, also referred to as an optical gel. Phosphor particles may be mixed within the optical gel in that embodiment so as to further diffuse light emitted by the LED dies 60.

Though the illustrated embodiment shows all of the LED dies 60 being encapsulated within a single cap 80, it is understood that a plurality of diffuser caps may be used in other embodiments. For example, each of the LED dies 60 may be encapsulated within a respective one of the plurality of diffuser caps.

In the embodiments illustrated in FIG. 1, the plurality of LED dies 60 are electrically coupled together in series by a plurality of bonding wires 105. The LED dies may have other coupling configurations in other embodiments, however, for example they may be electrically coupled together in parallel. Furthermore, although the lighting instrument 50 includes a plurality of LED dies 60 in the embodiment illustrated in FIG. 1, other embodiments of the lighting instrument 50 may include and use a single LED die as its light source.

The LED dies 60 are located on metal pads 110, respectively. The metal pads 110 are thermally conductive. In various embodiments, the metal pads 110 may include Aluminum, Copper, or another suitable metal or metal alloy. The metal pads 110 facilitate the dissipation of the heat (thermal energy) generated by the LED dies 60. Two of the LED dies 60 located at the opposite ends of the series coupling are also electrically coupled to metal pads 120 through bonding wires 125. In some embodiments, the metal pads 120 may have a composition substantially similar to that of the metal pads 110. Through the metal pads 120, electrical connections between the LED dies 60 and external devices may be established.

The metal pads 110 and 120 are located on a layer 140. The layer 140 includes a thermally conductive material, which helps facilitate the dissipation of heat produced by the LED dies 60. In some embodiments, the layer 140 may also be electrically insulating. For example, the layer 140 may include a ceramic material or a thermal glue material, which are both thermally conductive yet electrically insulating materials.

The layer 140 is located on a substrate 150, which may be made of silicon or a ceramic material. The substrate 150 has good thermal conductivity and further facilitates the dissipation of heat produced by the LED dies 60. While silicon may be suitable for manufacturing due to a lower cost than ceramic, the ceramic substrate offers good thermal conductivity. In some embodiments, the substrate 150 has a horizontal dimension (width) 160 and a vertical dimension (thickness or height) 170 as shown in FIG. 1. In some embodiments, the horizontal dimension 160 is in a range from about a few hundred microns to about a few centimeters, and the vertical dimension 170 is in a range from about 50 microns to about 1 millimeter. The horizontal dimension 160 and the vertical dimension 170 are also positively correlated (e.g., proportional to each other). In some embodiments, a higher value of the horizontal dimension 160 corresponds to a higher value of the vertical dimension 170, and vice versa. In other words, as the surface area of the substrate 150 expands, it becomes thicker. Conversely, as the surface area of the substrate 150 shrinks, it becomes thinner. This type of configuration helps ensure that the substrate 150 does not become brittle or breakable.

The substrate 150 is located on an interlayer material 180. The interlayer material 180 is thermally conductive and further facilitates heat dissipation. In various embodiments, the interlayer 180 may include thermal grease, one or more thermally-conductive pads (e.g., metal pads), solder, etc.

The interlayer material 180 is located on a thermal dissipation structure 200, also referred to as a heat sink 200. The heat sink 200 is thermally coupled to the LED dies 60 through the metal pads 110, the layer 140 (which includes a thermally conductive material as discussed above), the substrate 150 (which may be either silicon or ceramic as discussed above), and the interlayer material 180 (which may include thermal grease, metal pads, or solder, as discussed above). The heat sink 200 is configured to facilitate heat dissipation to the ambient atmosphere. The heat sink 200 contains a thermally conductive material, such as a metal material. The shape and geometries of the heat sink 200 may be designed to provide a framework for a familiar light bulb while at the same time spreading or directing heat away from the LED dies 60. To enhance heat transfer, the heat sink 200 may have a plurality of fins 210 that protrude outwardly from a body of the heat sink 200. The fins 210 may have substantial surface area exposed to ambient atmosphere to facilitate heat transfer.

From the discussions above, it can be seen that certain aspects of the present disclosure pertain to effective heat dissipation through a silicon substrate, for example the substrate 150. Thermal energy is conducted from the LED dies 60 to the thermal dissipation structure 200 through the substrate 150 (among other components). Silicon is a relatively efficient thermal energy transfer medium. In comparison, many traditional LED-based illumination devices use a Metal Core Printed Circuit Board (MCPCB) to conduct thermal energy from the LED dies to the heat sink. Though a typically MCPCB includes metal, which is thermally conductive, it also typically includes one or more dielectric layers that are not good thermal conductors. Thus, the thermal conduction performance for an MCPCB is worse than that of silicon. In other words, the lighting instrument 50 illustrated herein possesses superior heat dissipation characteristics through the use of a substrate 150, rather than an MCPCB. Furthermore, MCPCBs are more expensive than silicon substrates. Therefore, the use of the substrate 150 (as opposed to the MCPCB) to dissipate heat herein also saves fabrication costs.

Figure 2:
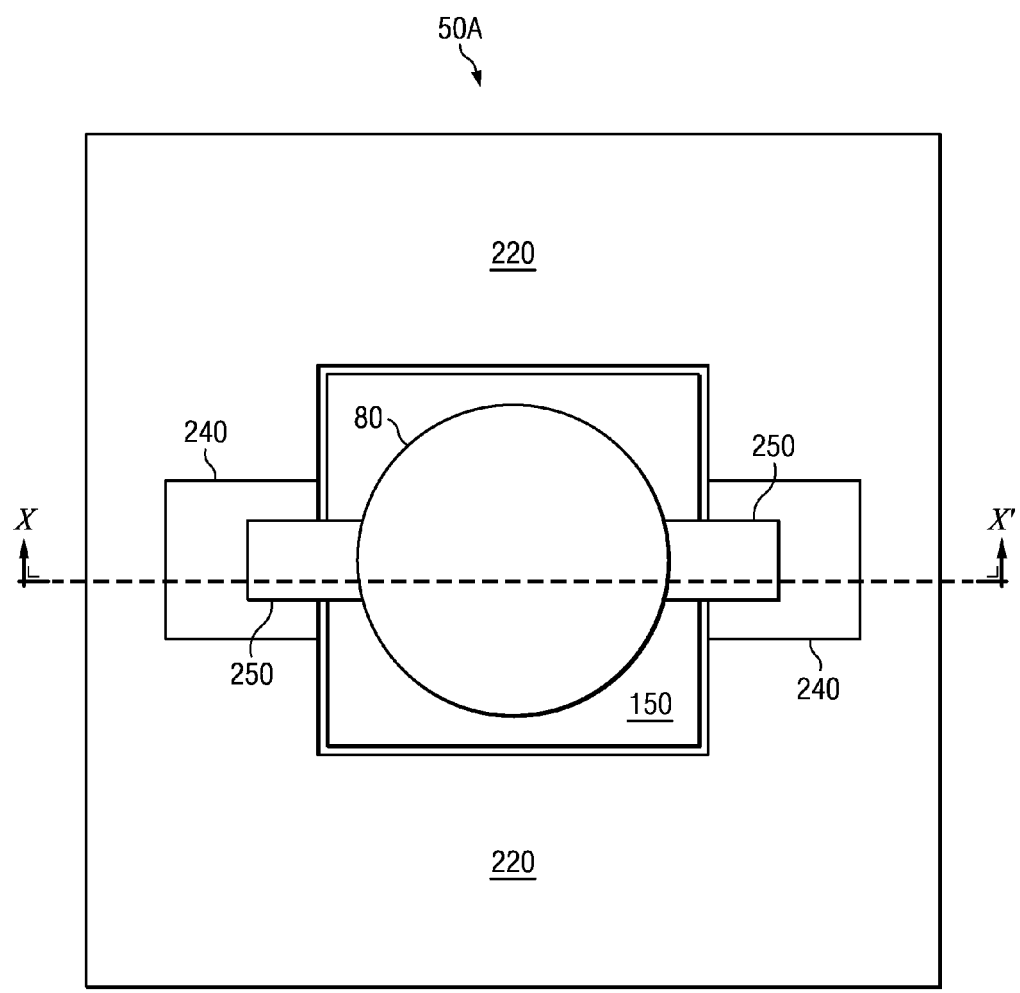
FIGS. 2-4 are diagrammatic fragmentary top views of an example lighting apparatus according to different embodiments of the present disclosure.
Figure 3:
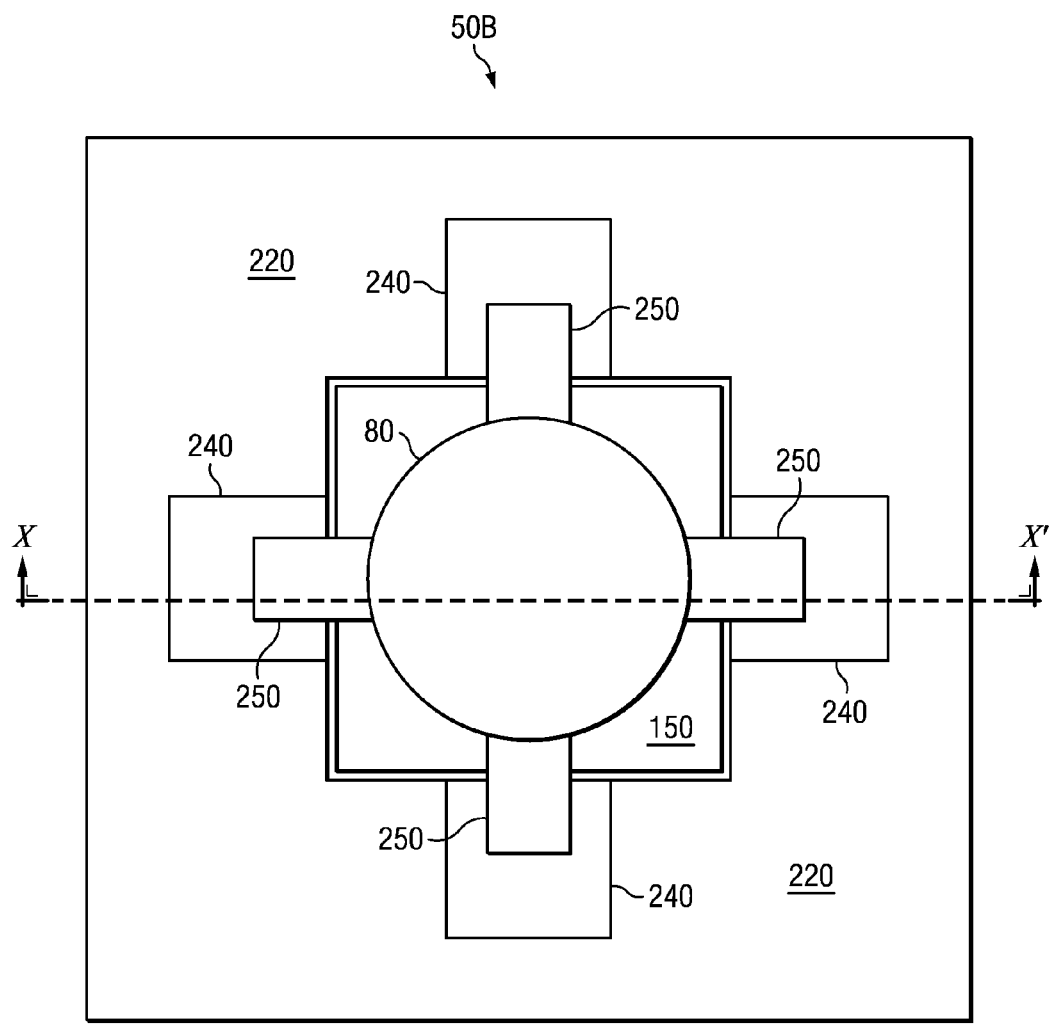
Figure 4:
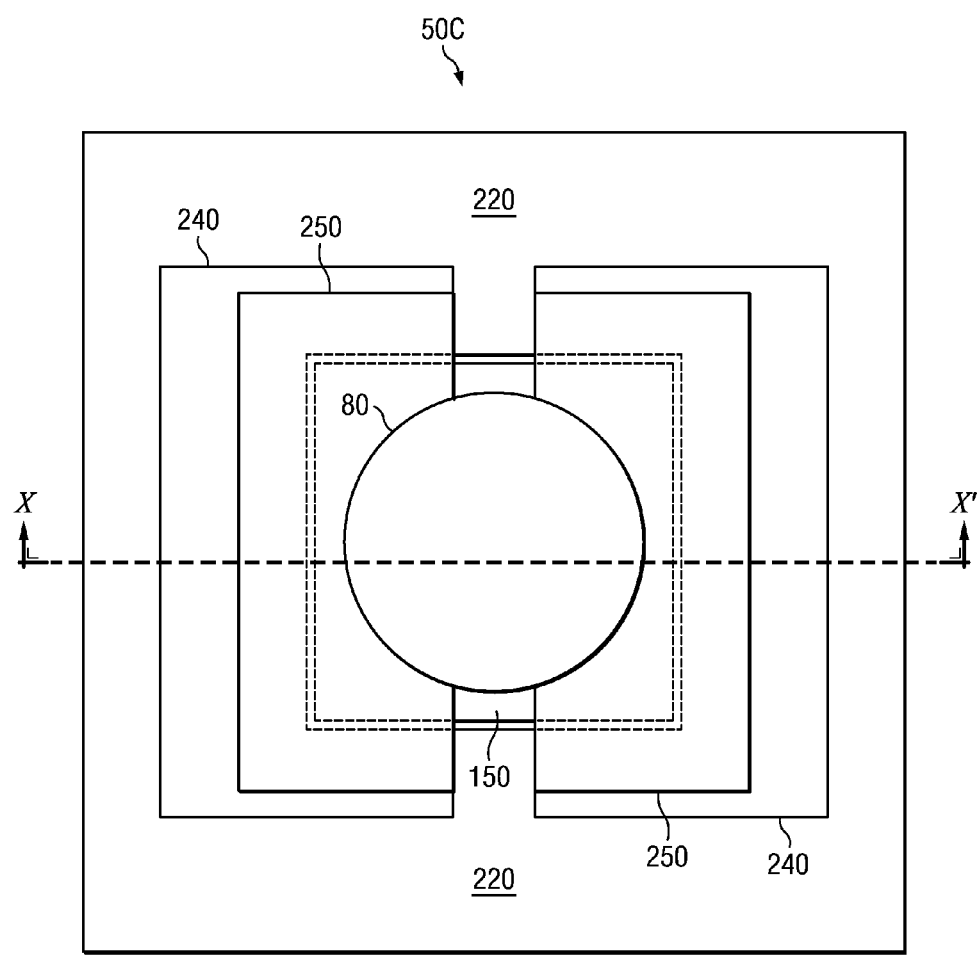

According to various embodiments of the present disclosure, since the substrate 150 is used herein to facilitate the dissipation of thermal energy, it is free of dielectric layers, which tend to have poor thermal conduction characteristics. As such, the substrate 150 is free of electrical routing layers. Instead, the electrical routing tasks are performed by a printed circuit board (PCB) substrate 220. As shown in FIG. 1, the PCB substrate 220 is located horizontally adjacent to the substrate 150. The sidewalls of the PCB substrate 220 and the sidewalls of substrate 150 are spaced apart by a small distance. In other words, there may be a gap between the PCB substrate 220 and the substrate 150. The gap may be filled by air or another electrically-insulating material. In some embodiments, the PCB substrate 220 surrounds (or at least partially surrounds) the substrate 150 in a top view. Several example top views are shown in FIGS. 2-4 and are discussed later.

Still referring to FIG. 1, the PCB substrate 220 is attached to the thermal dissipation structure 200 by fixing screws 230 in the illustrated embodiments. In alternative embodiments, the PCB substrate 220 may be secured to the thermal dissipation structure 200 by other suitable mechanisms. In some embodiments, the PCB substrate 220 has one or more electrical routing layers that can carry out the routing of electrical signals. The electrical routing layers may contain metal traces, vias, and other suitable passive or active electronic circuit components. Electrical connectivity to the PCB substrate 220 is obtained through metal pads 240, which may be located on an upper surface of the PCB substrate 220. These metal pads 240 are electrically coupled to metal pads 250 through solder materials 260. The metal pads 250 are also electrically coupled to the metal pads 120. In this manner, electrical connections to the LED dies 60 may be established through the metal pads 120, 250, 240, and the PCB substrate 220. In certain embodiments, however, the PCB substrate 220 need not contain electrical routing layers. Instead, the electrical connections between the LED dies 60 and external devices may be established through the metal pads 120, 250, and 240.

Since the electrical routing functions are performed at least in part by the PCB substrate 220, the substrate 150 only needs to handle the heat dissipation for the LED dies 60. As the LED dies 60 collectively occupy a limited (e.g., relatively small) area, the substrate 150 need not have a great size to perform its heat dissipation task effectively. For example, the horizontal dimension 160 of the substrate 150 may exceed the horizontal area collectively occupied by the LED dies 60, or an area covered by the cap 80, but not by much. This is because silicon is a brittle material, and as the size of the substrate 150 increases, the more breakable it becomes. A relatively small size for the substrate 150 will increase its mechanical strength and durability.

In some embodiments, the size of the substrate 150 is configured while taking both thermal dissipation and breakability into considerations. Thus, the size (e.g., the dimension 160) of the substrate 150 may be configured to be large enough to effectively facilitate heat transfer, but still small enough to avoid mechanical breaking issues. In other words, the design of the substrate 150 may involve making a tradeoff between heat dissipation and mechanical durability.

FIGS. 2-4 are simplified diagrammatic fragmentary top views of the lighting instrument 50 according to various embodiments. In more detail, FIGS. 2-4 illustrate top views of lighting instruments 50A-50C, respectively, wherein the cross-sectional views of these lighting instruments 50A-50C may be obtained by "cutting" along a dashed line in FIGS. 2-4 from point X to point X'. The resulting cross-sectional view of the lighting instruments 50A-50C may be substantially similar to the cross-sectional view illustrated in FIG. 1. Also, for reasons of consistency and clarity, similar components are labeled the same throughout FIGS. 1-4.

Referring to FIG. 2, the embodiment of the lighting instrument 50A includes a plurality of LED dies (not illustrated) that are covered by the cap 80. These LED dies are located on the substrate 150, which is surrounded (or encircled) by the PCB substrate 220. As discussed above, the substrate 150 has a relatively small area and thus has good durability and is not likely to break. In addition, since silicon has favorable thermal conduction characteristics, the substrate 150 can efficiently transfer the heat generated by the LED dies to the heat sink therebelow (not illustrated).

Meanwhile, the LED dies are electrically coupled to the metal pads 250 and 240. These metal pads 240-250 may be used to gain electrical access to the LED dies. For example, the metal pad 240 on one side of the cap 80 may serve as an anode contact, and the metal pad 240 on the opposite side of the cap 80 may serve as a cathode contact, or vice versa. A voltage may be applied through the anode and cathode contacts to power on the LED dies so that they can illuminate light. In embodiments where additional electrical routing is needed, the PCB substrate 220 may contain various electrical routing layers to carry out the routing.

Referring now to FIG. 3, the lighting instrument 50B is similar to the lighting instrument 50A, in that the heat dissipation for the LED dies is performed using the substrate 150, and that the electrical connections to the LED dies may be established through the PCB substrate 220 and the metal pads 240-250. One difference between the lighting instrument 50A of FIG. 2 and the lighting instrument 50B of FIG. 3 is that the lighting instrument 50B has more metal pads 240-250. For example, in addition to the metal pads 240-250 on the "left" and "right" sides of the cap 80, there are also metal pads 240-250 on the "top" and "bottom" sides of the cap 80. Note that the terms "left," "right," "top," and "bottom" are used herein as examples with reference to the top view of FIG. 3, and they do not indicate any specific type of configuration relationship to the LED dies in actuality.

Referring now to FIG. 4, the lighting instrument 50C is similar to the lighting instrument 50A, in that the heat dissipation for the LED dies is performed using the substrate 150, and that the electrical connections to the LED dies may be established through the PCB substrate 220 and the metal pads 240-250. One difference between the lighting instrument 50A of FIG. 2 and the lighting instrument 50C of FIG. 4 is that the lighting instrument 50C has relatively "big" metal pads 240 and 250 on either side of the cap 80. These "big" metal pads 250 cover up a substantial portion of the substrate 150 from a top view. The outline or top-view profile of the substrate 150 is delineated as the dashed square that surrounds the cap 80. Though the metal pads 240-250 are configured somewhat differently in the embodiments illustrated in FIG. 4, the intended operation of the lighting instrument 50C is not substantially different from that of the lighting instrument 50A or 50B.

Note that the lighting instruments 50A-50C may include additional components. For example, the lighting instruments 50A-50C may include reflector cups (or another suitable reflective structure) for the reflection of light. For reasons of simplicity, however, these additional components are neither illustrated nor discussed herein.

Figure 5:
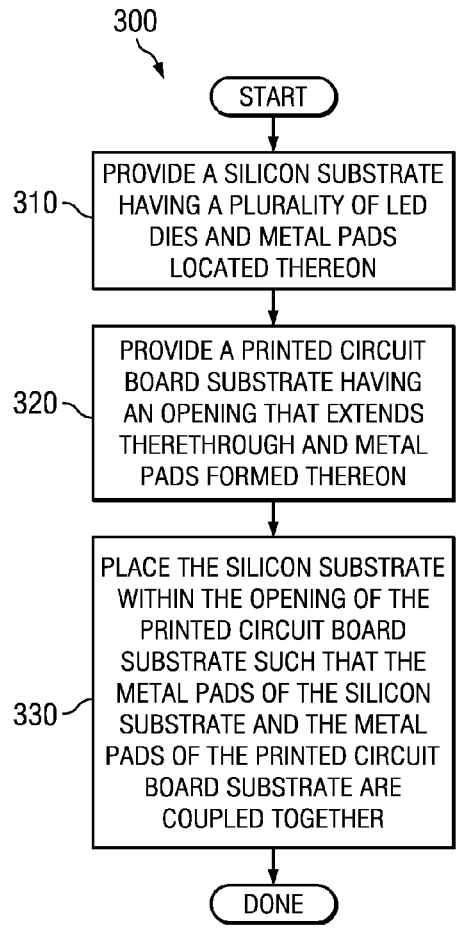
FIG. 5 is a flowchart illustrating a method of fabricating a lighting apparatus using a semiconductor photonic device as a light source according to various aspects of the present disclosure.

FIG. 5 is a flowchart of a method 300 for fabricating a lighting apparatus using a semiconductor photonic device as a light source according to various aspects of the present disclosure. The method 300 includes a block 310, in which a substrate is provided or obtained. In some embodiments, the substrate is a silicon substrate. In other embodiments, the substrate may be a ceramic substrate. The substrate has a plurality of LED dies located thereon. The LED dies are thermal-conductively coupled to the substrate. The substrate also has a plurality of metal pads located thereon. In some embodiments, the LED dies may each be located on a respective one of the metal pads. Some of the metal pads also partially extend beyond the substrate. For example, the metal pads 250 of FIG. 1 may be viewed as the metal pads extending partially beyond the substrate 150. The LED dies may be electrically coupled together in series through a plurality of bonding wires. The bonding wires may also electrically couple the LED dies with the metal pads extending beyond the substrate. The LED dies may also be coated with a phosphor material.

The method 300 includes a block 320, in which a printed circuit board (PCB) substrate is provided or obtained. The PCB substrate contains an opening that extends therethrough (e.g., from a front side of the printed circuit board substrate to a back side). The PCB substrate may contain one or more electrical routing layers. The PCB substrate may also contain metal pads located on its front surface. For example, the metal pads 240 of FIG. 1 may be viewed as these metal pads.

The method 300 includes a block 330, in which the substrate is placed within the opening of the PCB substrate. In other words, the substrate is "inserted" into the opening of the PCB substrate. The sidewall of the substrate is spaced apart (i.e., not touching) the sidewall of the PCB substrate. After the substrate is placed within the PCB substrate, the LED dies on the substrate are still located above the front surface of the PCB substrate. As a part of the insertion process, the metal pads (e.g., metal pads 250 of FIG. 1) located on and extending beyond the substrate are also placed on the metal pads (e.g., metal pads 240 of FIG. 1) located on the PCB substrate. These metal pads are electrically coupled together through a suitable process such as a soldering process. A solder material may be disposed between these metal pads to enhance the soldering process. Thus, the LED dies are electrically coupled to the PCB substrate, and may therefore be electrically accessed through the PCB substrate. For example, through the metal pads on the substrate and the PCB substrate, a voltage can be applied to areas of the PCB substrate to control the operation of the LED dies located on the substrate.

Additional processes may be performed before, during, or after the blocks 310-330 discussed herein to complete the fabrication of the lighting apparatus. For example, an encapsulation structure such as a diffuser cap may be formed over the LED dies to house the LED dies therein. Furthermore, the PCB substrate may have a plurality of openings, and the process discussed above may be performed to insert a plurality of substrates having LED dies located thereon into the openings of the PCB substrate. For the sake of simplicity, these additional processes are not discussed herein.

The lighting instrument 50 according to the embodiments disclosed herein offers advantages over existing semiconductor-based lighting products. However, not all advantages are necessarily discussed herein, and different embodiments may offer additional advantages, and that no particular advantage is necessarily required for all embodiments.

One advantage of the embodiments disclosed herein is that an MCPCB substrate is no longer required to perform thermal dissipation. MCPCBs typically have poor thermal conduction characteristics and are also expensive. In comparison, the substrate used herein is cheaper and have better thermal conduction capabilities. Hence, heat generated by the LED dies in operation can be quickly and efficiently dissipated without causing damage to the LED dies. In addition, since the substrate used herein is small, they are not as brittle or breakable as larger substrates.

Another advantage of the embodiments disclosed herein is the elimination of Through-Silicon-Vias (TSV). Existing approaches of using silicon substrates to dissipate heat for LED devices usually require TSVs to establish electrical connections to the LED dies. TSVs are expensive and require complex and lengthy fabrication processes to form. As one example, TSVs need to be shielded by an electrically-insulating material so that electrical leakage does not occur. Forming such electrically-insulating material in a silicon substrate is time consuming and costly. Here, since the thermal conduction is performed by the silicon substrate, and the electrical routing may be done using the PCB substrate and the metal pads located thereon, TSVs are no longer needed, thereby reducing fabrication time and cost.

Figure 6:
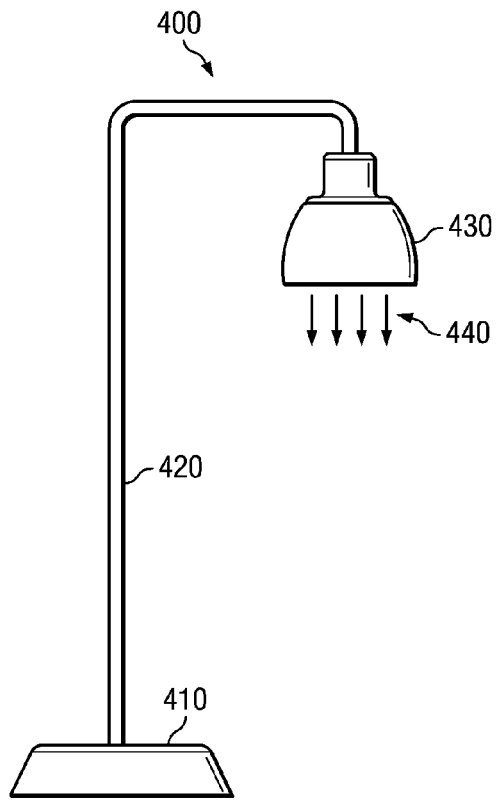
FIG. 6 is a diagrammatic view of a lighting module that includes a photonic lighting apparatus of FIGS. 1-4 according to various aspects of the present disclosure.

FIG. 6 illustrates a simplified diagrammatic view of a lighting module 400 that includes some embodiments of the lighting instrument 50 discussed above. The lighting module 400 has a base 410, a body 420 attached to the base 410, and a lamp 430 attached to the body 420. In some embodiments, the lamp 430 is a down lamp (or a down light lighting module).

The lamp 430 includes the lighting instrument 50 discussed above with reference to FIGS. 1-5. In other words, the lamp 430 of the lighting module 400 includes an LED-based light source, a diffuser cap that encapsulate the LED light source therein, a small silicon substrate and a heat sink for dissipating the heat generated by the LED light source, and a PCB substrate and a plurality of metal pads for establishing electrical connections to the LED light source. Due at least in part to the advantages discussed above, the LED packaging for the lamp 430 is operable to dissipate heat effectively while enjoying good mechanical durability compared to traditional LED packaging. In addition, due at least in part to the improved heat dissipation capabilities, the lamp 430 can offer a longer lifetime compared to traditional LED lamps.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting apparatus, comprising:
a thermally-conductive substrate;
a first conductive pad and a second conductive pad each disposed over the thermally-conductive substrate;
a printed circuit board located besides the thermally-conductive substrate, the printed circuit board and the thermally-conductive substrate having different material compositions;
a third conductive pad disposed over the printed circuit board;
a fourth conductive pad disposed over both the second conductive pad and the third conductive pad;
a photonic device located over the first conductive pad, the photonic device being thermally coupled to the thermally-conductive substrate via the first conductive pad and electrically coupled to the printed circuit board via the second, third, and fourth conductive pads; and
a thermal dissipation structure thermally coupled to the thermally-conductive substrate.

2. The lighting apparatus of claim 1, wherein the thermally-conductive substrate includes a silicon substrate or a ceramic substrate free of electrical routing therein.

3. The lighting apparatus of claim 1, wherein the photonic device is thermally coupled to the thermally-conductive substrate through a thermally conductive but electrically insulating layer.

4. The lighting apparatus of claim 1, wherein the photonic device includes one or more light-emitting diode (LED) dies.

5. The lighting apparatus of claim 1, wherein the thermally-conductive substrate is surrounded by the printed circuit board in a top view.

6. The lighting apparatus of claim 1, wherein a sidewall of the thermally-conductive substrate is spaced apart from a sidewall of the printed circuit board.

7. The lighting apparatus of claim 1, wherein the printed circuit board is attached to the thermal dissipation structure by one or more screws.

8. The lighting apparatus of claim 1, wherein the photonic device and the thermal dissipation structure are located on opposite sides of the thermally-conductive substrate.

9. A photonic lighting module, comprising:
a heat sink;
a substrate disposed over the heat sink and thermally coupled to the heat sink;
a printed circuit board substrate disposed over the heat sink, the printed circuit board substrate surrounding the substrate;
a plurality of metal pads disposed at least partially over the substrate and over the printed circuit board substrate, wherein at least one of the metal pads is disposed partially over both the substrate and the printed circuit board substrate; and
one or more light-emitting devices disposed on a subset of the metal pads;
wherein:
the one or more light-emitting devices are thermally coupled to the heat sink through the substrate;
the one or more light-emitting devices are electrically coupled to the printed circuit board substrate through the metal pads; and
the at least one of the metal pads is disposed directly above a first one and a second one of the metal pads, the first one of the metal pads being disposed over the substrate, and the second one of the metal pads being disposed over the printed circuit board substrate.

10. The photonic lighting module of claim 9, wherein the light-emitting devices include light-emitting diodes.

11. The photonic lighting module of claim 9, further comprising:
an electrically-insulating layer disposed between the substrate and the one or more light-emitting devices; and
a thermally-conductive layer disposed between the substrate and the heat sink, the electrically-insulating layer and the thermally-conductive layer being disposed on opposite sides of the substrate.

12. The photonic lighting module of claim 9, wherein the substrate is free of being in physical contact with the printed circuit board substrate.

13. The photonic lighting module of claim 9, further comprising a cap disposed over the substrate, wherein the cap houses the one or more light-emitting devices therein.

14. The photonic lighting module of claim 9, wherein:
the printed circuit board substrate contains electrical routing circuitry; and
the substrate contains no electrical routing circuitry, and wherein the substrate contains silicon or ceramic.

15. A packaging structure for a light-emitting device, comprising:
a printed circuit board structure having an opening extending therethrough;
a substrate positioned within the opening of the printed circuit board structure;
a heat sink on which the printed circuit board structure and the substrate are located;
a first metal pad located over the substrate, wherein the light-emitting device is thermally coupled to the first metal pad;
a second metal pad located over the printed circuit board structure, wherein the second metal pad is electrically coupled to the light-emitting device; and
a third metal pad disposed partially over both the substrate and the printed circuit board structure, wherein the third metal pad is electrically coupled to the second metal pad through a conductive material or metal and to the light-emitting device through a bonding wire, and wherein the third metal pad is disposed over both the first metal pad and the second metal pad.

16. The packaging structure of claim 15, wherein the light-emitting device includes a light-emitting diode die, and wherein the substrate is one of: a silicon substrate and a ceramic substrate.

17. The packaging structure of claim 15, wherein a sidewall of the substrate is free of being in physical contact with a sidewall of the printed circuit board structure.

18. The packaging structure of claim 15, further comprising a cap disposed over the substrate and housing the light-emitting device therein.

\* \* \* \* \*